US010256730B2

(12) United States Patent
Kitanaka et al.

(10) Patent No.: US 10,256,730 B2
(45) Date of Patent: Apr. 9, 2019

(54) POWER CONVERSION DEVICE

(71) Applicant: MITSUBISHI ELECTRIC CORPORATION, Chiyoda-ku, Tokyo (JP)

(72) Inventors: Hidetoshi Kitanaka, Tokyo (JP); Hirokazu Takabayashi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/068,154

(22) PCT Filed: Feb. 19, 2016

(86) PCT No.: PCT/JP2016/054845
§ 371 (c)(1),
(2) Date: Jul. 5, 2018

(87) PCT Pub. No.: WO2017/141422
PCT Pub. Date: Aug. 24, 2017

(65) Prior Publication Data
US 2019/0020279 A1      Jan. 17, 2019

(51) Int. Cl.
*H01F 27/02* (2006.01)
*H02M 3/28* (2006.01)

(52) U.S. Cl.
CPC ............ *H02M 3/28* (2013.01); *H01F 27/025* (2013.01)

(58) Field of Classification Search
CPC ........ H01F 27/02; H01F 27/025; H01F 27/06; H01F 27/08; H02M 3/22; H02M 3/28;
(Continued)

(56) References Cited

U.S. PATENT DOCUMENTS 3,684,943 A * 8/1972 Demarest ................ H01L 25/03
361/696
6,897,753 B2 * 5/2005 Dixon .................... H01F 27/027
174/138 G
(Continued)

FOREIGN PATENT DOCUMENTS

WO    WO 2014/010240 A1    1/2014

OTHER PUBLICATIONS

International Search Report (PCT/ISA/210) dated May 10, 2016, by the Japanese Patent Office as the International Searching Authority for International Application No. PCT/JP2016/054845.
(Continued)

*Primary Examiner* — Adolf D Berhane
(74) *Attorney, Agent, or Firm* — Buchanan Ingersoll & Rooney PC

(57) ABSTRACT

A housing of a power conversion device is partitioned into sealed and open parts. A first housing containing a primary-side electronic component connected to a primary winding of a transformer has a first opening through which a first connection conductor is inserted, the first opening being blocked by an aperture surface included in a third housing containing the transformer and filled with an insulating member. A shortest distance between the first connection conductor and an edge of the first opening is greater than or equal to a first threshold. A second housing containing a secondary-side electronic component connected to a secondary winding of the transformer has a second opening through which a second connection conductor is inserted, and is blocked by the aperture surface. A shortest distance between the second connection conductor and an edge of the second opening is greater than or equal to a second threshold.

4 Claims, 7 Drawing Sheets

(58) Field of Classification Search
CPC .... H02M 3/325; H02M 3/335; H05K 5/0004; H05K 5/0021; H05K 5/0091
See application file for complete search history.

(56) References Cited

U.S. PATENT DOCUMENTS

| | | | | |
|---|---|---|---|---|
| 2008/0238356 | A1* | 10/2008 | Batson | H02J 7/0045 |
| | | | | 320/103 |
| 2010/0328893 | A1* | 12/2010 | Higashidani | H05K 7/20927 |
| | | | | 361/702 |
| 2012/0075048 | A1* | 3/2012 | MacLennan | H01F 27/06 |
| | | | | 336/60 |
| 2015/0036389 | A1* | 2/2015 | Freeman | H02M 1/10 |
| | | | | 363/16 |
| 2015/0171604 | A1 | 6/2015 | Kawasaki et al. | |
| 2015/0357923 | A1* | 12/2015 | Nakazawa | H02M 3/33576 |
| | | | | 363/17 |
| 2016/0204689 | A1* | 7/2016 | Wennerstrom | H02P 6/14 |
| | | | | 318/400.26 |
| 2016/0352240 | A1* | 12/2016 | Kristensen | H02M 7/003 |
| 2017/0170736 | A1* | 6/2017 | Hirashima | H02M 1/44 |
| 2018/0047499 | A1* | 2/2018 | Smith | H01F 27/02 |
| 2018/0197673 | A1* | 7/2018 | Njiende | H01F 3/10 |

OTHER PUBLICATIONS

Written Opinion (PCT/ISA/237) dated May 10, 2016, by the Japanese Patent Office as the International Searching Authority for International Application No. PCT/JP2016/054845.

* cited by examiner

POWER CONVERSION DEVICE

TECHNICAL FIELD

The present disclosure relates to a power conversion device for prevention of induction heating by a transformer.

BACKGROUND ART

A power conversion device is mounted on the roof or under the floor of an electric railway car to convert electric power obtained from a power contact line and supply electric power to an electric motor or vehicle-installed equipment. The power conversion device has an inverter circuit for output of a desired alternating current power by switching operation of semiconductor elements, a transformer for performing power conversion between a primary side and a secondary side in a state in which the primary side is insulated from the secondary side, and a rectifier circuit for rectification of the output power of the transformer. A main transformer and a high-voltage device box containing a circuit breaker and an arrester are installed under the floor of a railway car as disclosed in Patent Literature 1.

CITATION LIST

Patent Literature

Patent Literature 1: International Publication No. WO2014/010240

SUMMARY OF INVENTION

Technical Problem

The semiconductor elements generate heat during the switching operation, and thus fins or a spike-array-shaped heat sink is formed on the board on which the semiconductor elements are arranged. The heat sink is arranged at a position contacting outside air in order to increase cooling efficiency. In the same manner, the transformer also generates heat during power conversion and thus is arranged at a position contacting the outside air. However, in order to prevent failure due to dust and moisture, electronic components included in an output controller for outputting a control signal to the inverter circuit are arranged at the interior of a housing that does not contact the outside air. In this manner, the locations of arrangement of each component included in the power conversion device are determined in accordance with the requirement for cooling and the requirement for dust-proofing and water-proofing.

In the case in which the transformer is arranged at a position contacting the outside air and the semiconductor elements connected to the transformer are arranged at the interior of the housing, insertion holes are arranged in the housing for insertion of conductors to connect together wiring of the transformer and the electronic components. In order to secure hermetic sealing of the interior of the housing, the insertion holes are filled with a sealant after insertion of the conductors in the insertion holes. In this case, the connection structure of the transformer is increasingly complex, and due to the requirement for filling with the sealant, the work of installation and replacement of the transformer in the housing is increasingly complex, and maintainability worsens.

Further, applying a high frequency voltage to the transformer is effective for size and weight reduction of the transformer. In order to apply the high frequency voltage to the transformer, an increase is required in the operating frequency of the inverter circuit generating the alternating current voltage input to the transformer, and an increase is required in the operating frequency of the rectifier circuit rectifying the alternating current power output from the transformer. In this case, a high-frequency large current flows in the transformer and the aforementioned conductors. In the case in which the transformer mounted on the electric railway car has a conversion capacity of several tens of kVA to several hundred kVA, an appropriate frequency of the voltage applied to the transformer is about 20 kHz. If the transformer has the aforementioned connection structure, the separation between the housing and the conductors is small in the vicinity of the insertion holes, and thus induction heating of the housing may occur due to the high-frequency large current flowing through the conductors. Changing the material of the housing or cooling of the housing is required in order to prevent induction heating of the housing, and thus the resultant structure is complex.

The present disclosure is developed in consideration of the aforementioned circumstances, and an objective of the present disclosure is to, by use of a more simplified structure, prevent induction heating of components in the vicinity of the transformer.

Solution to Problem

In order to attain the aforementioned objective, the power conversion device of the present disclosure includes a transformer, a first connection conductor, a second connection conductor, a first housing, a second housing, and a third housing. The transformer performs power conversion in a state in which the primary side and the secondary side are insulated from each other. The first connection connector is to electrically connect together a primary winding of the transformer and a primary-side electronic component. The second connection conductor is to electrically connect together the secondary winding of the transformer and a secondary-side electronic component. The first housing contains the primary-side electronic component and includes a first opening part through which the first connection conductor is inserted. The second housing contains the secondary-side electronic component and includes a second opening part through which the second connection conductor is inserted. The third housing contains the transformer and includes a surface in which an aperture is formed through which the first connection conductor and the second connection conductor are inserted. The interior of the third housing is filled with an insulating member and the insulating member in the interior of the third housing seals the transformer, a portion of the first connection conductor, and a portion of the second connection conductor. The first opening part and the second opening part are blocked by one surface, in which is formed the aperture, of the third housing filled by the insulating member. A shortest distance between an edge of the first opening part and the first connection conductor is greater than or equal to a first threshold, and a shortest distance between an edge of the second opening part and the second connection conductor is greater than or equal to a second threshold. The third housing is disposed at a position such that at least a portion of an outer surface of the third housing contacts outside air.

Advantageous Effects of Invention

According to the present disclosure, the connection conductors connecting together the transformer and the electronic components are sealed by the insulating member and are arranged so as to be separated by a fixed distance from the housings, and the third housing containing the transformer is arranged at a position such that at least a portion of the outer surface contacts the outside air, and thus by a more simplified structure, the transformer is cooled and induction heating of the components in the vicinity of the transformer can be prevented.

DESCRIPTION OF EMBODIMENTS

Figure 1:
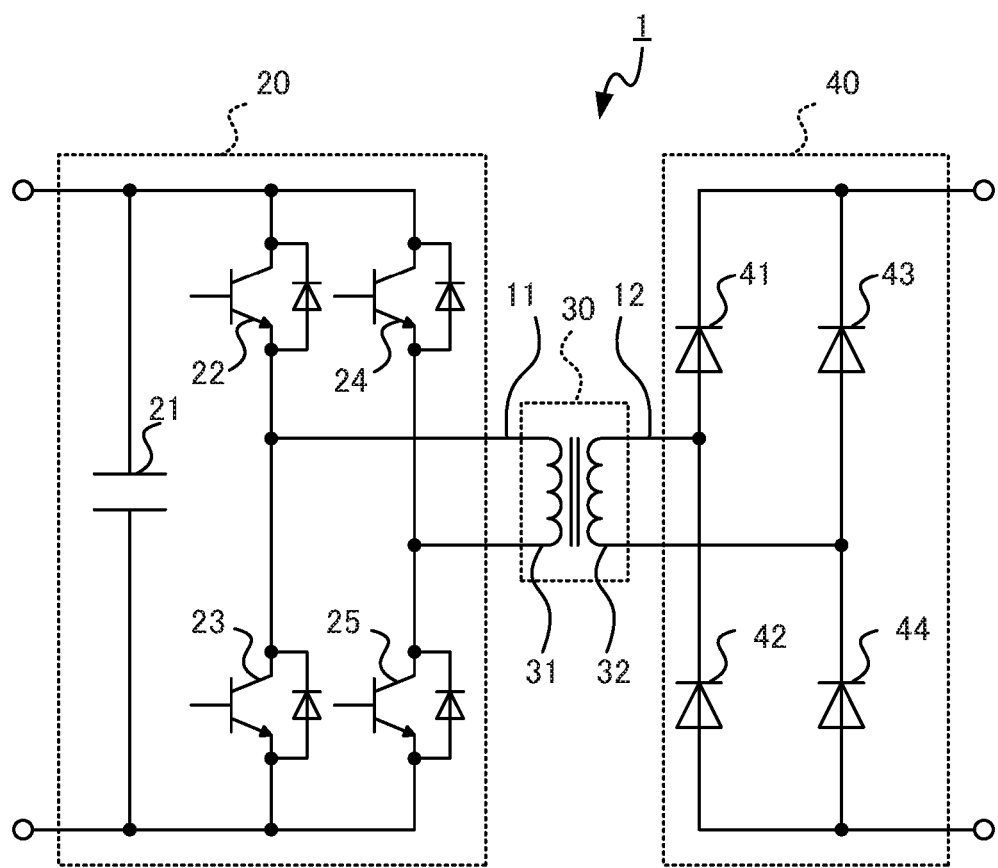
FIG. 1 is a drawing illustrating an example configuration of a power conversion device according to an embodiment of the present disclosure.

Embodiments of the present description are described below in detail with reference to drawings. In the drawings, components that are the same or equivalent are assigned the same reference signs.

FIG. 1 is a block diagram illustrating an example configuration of a power conversion device according to an embodiment of the present disclosure. The power conversion device 1 is equipped with a primary circuit 20, a transformer 30 for performing power conversion under a state in which the primary side and the secondary side are insulated from each other, and a secondary circuit 40. Although the primary circuit 20 in the example of FIG. 1 is an inverter circuit that has a capacitor 21 and switching elements 22, 23, 24, and 25, the configuration of the primary circuit 20 is not limited to the example of FIG. 1, and this circuit is any circuit for supplying alternating current power. Although the secondary circuit 40 in the example of FIG. 1 is a rectifying circuit that has diodes 41, 42, 43, and 44, in the same manner as the primary circuit 20, the configuration of the secondary circuit 40 is not limited to the example of FIG. 1, and this circuit is any circuit for supplying direct current power. The primary circuit 20 and the secondary circuit 40 do not contact air at the outside of the power conversion device 1. In the present embodiment, air at the outside of the power conversion device 1 is termed outside air. The primary circuit 20 and the secondary circuit 40 are arranged in a hermetically-sealed space that does not contact the outside air, and a housing that contains the transformer 30 is arranged at a position such that at least a portion of the outer surface contacts the outside air. A first connection conductor 11 electrically connects together the primary circuit 20 and a primary winding 31 of the transformer 30, and a second connection conductor 12 electrically connects together the secondary circuit 40 and a secondary winding 32 of the transformer 30. As described below, the first connection conductor 11 and the second connection conductor 12 are arranged at positions separated from components included in the housings containing the primary circuit 20 and the secondary circuit 40, thereby preventing induction heating of the housings.

Figure 2:
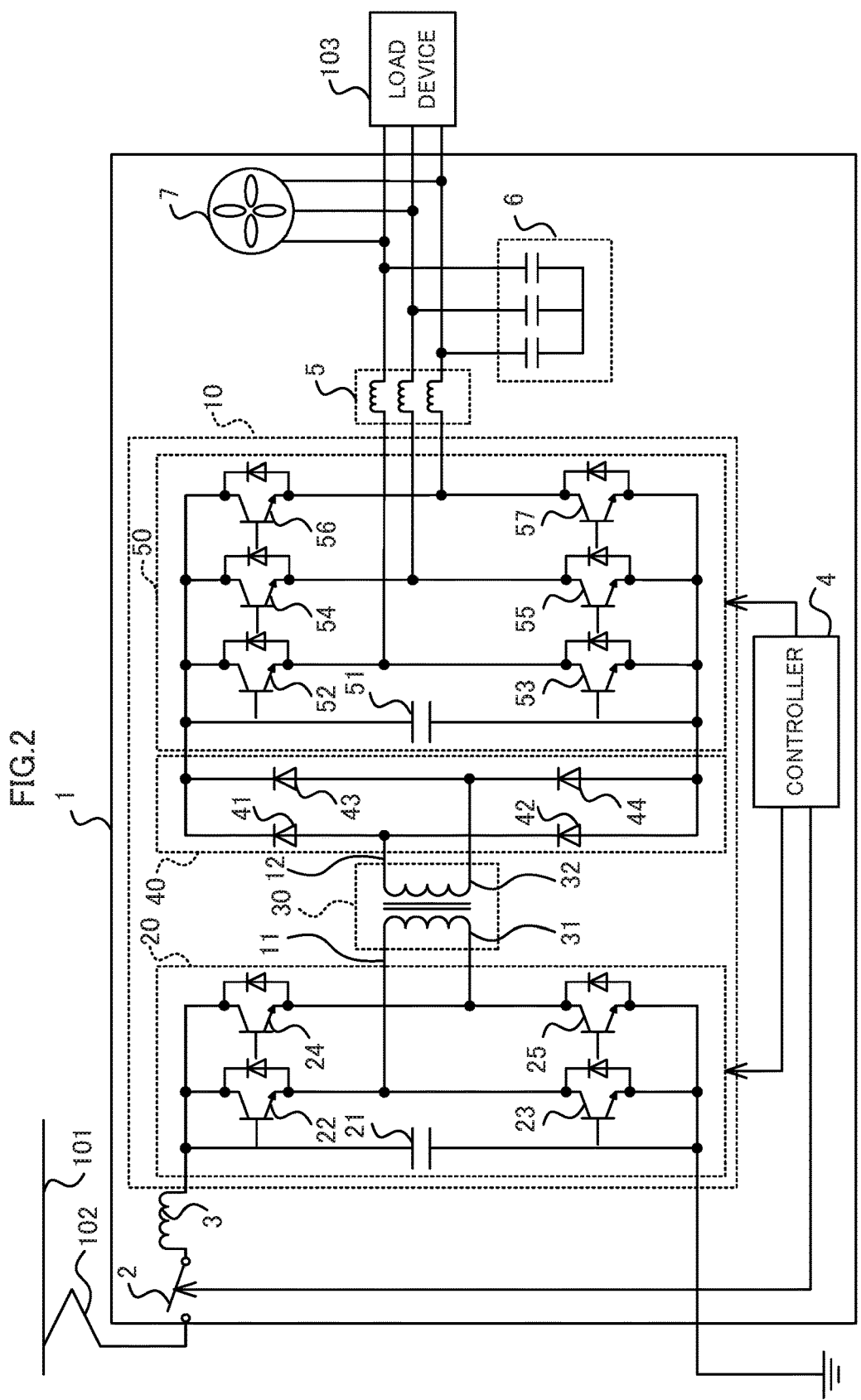
FIG. 2 is a drawing illustrating an example of mounting on an electric railway car the power conversion device according to the embodiment.

FIG. 2 is a drawing illustrating an example of mounting on an electric railway car the power conversion device according to the embodiment. The power conversion device 1 converts electric power acquired from a power contact line 101 via a power collector 102, and supplies electric power to a load device 103 that is an air conditioner or a lighting device connected to the output side. The electric power acquired from the power contact line 101 is input to a power converter 10 via a switch 2 and an input reactor 3. The power converter 10 has the primary circuit 20, the transformer 30, the secondary circuit 40, and a three-phase inverter circuit 50. In the example of FIG. 2, the switching elements 22, 23, 24, and 25 included in the primary circuit 20 that is the inverter circuit, and switching elements 52, 53, 54, 55, 56, and 57 included in the three-phase inverter circuit 50, are insulated gate bipolar transistors (IGBT), although any semiconductor element can be used for these components.

The switching frequency of the primary circuit 20 is about 20 kHz, and the primary circuit 20 converts direct current power to high frequency single-phase alternating current power. Although the primary circuit 20 in the example of FIG. 2 has a full-bridge configuration, a half-bridge configuration or another configuration may be used. A connection point of the switching elements 22 and 23 and one end of the primary winding 31 are connected via the first connection conductor 11, and a connection point of the switching elements 24 and 25 and the other end of the primary winding 31 are connected via the first connection conductor 11.

The transformer 30 performs power conversion in the state in which the primary side and the secondary side are insulated from each other. One end of the secondary winding 32 and a connection point of the diodes 41 and 42 are connected via the second connection conductor 12, and the other end of the secondary winding 32 and a connection point of the diodes 43 and 44 are connected via the second connection conductor 12. Due to use of a high frequency for the voltage applied to the transformer 30, size and weight of the transformer 30 can be reduced. When a high frequency is used for the voltage applied to the transformer 30, high-frequency alternating high-amperage currents flow through the first connection conductor 11 and the second connection conductor 12. If the switching frequency of the primary circuit 20 is about 20 kHz, currents of several hundred amperes flow through the first connection conductor 11 and the second connection conductor 12. Thin plate-like conductors or litz wiring of copper is used in order to suppress the generation of heat by the first connection conductor 11 and the second connection conductor 12.

The secondary circuit 40 rectifies the high-frequency alternating current voltage input from the transformer 30 to produce a direct current voltage, and applies the direct current voltage to a capacitor 51 included in the three-phase inverter circuit 50. The three-phase inverter circuit 50 performs power conversion and outputs a three-phase alternating current voltage of a desired frequency and desired magnitude. A controller 4 switches ON and OFF the switch 2, and controls the switching of the switching elements 22, 23, 24, 25, 52, 53, 54, 55, 56, and 57.

A reactor unit 5 including alternating current reactors arranged for each phase, a capacitor unit 6 including alternating current capacitors connected to each phase, a cooling blower 7, and a load device 103 are connected to the output side of the power converter 10. Due to the formation of a smoothing filter circuit by the reactor unit 5 and the capacitor unit 6, the pulse voltage waveform output by the three-phase inverter circuit 50 is smoothed, and a sine wave alternating current is obtained.

The primary circuit 20, the transformer 30, and the secondary circuit 40 generate heat, and thus cooling is required. Thus heat sinks of boards on which each of the components of the primary circuit 20 and the secondary circuit 40 are arranged, and the housing that contains the transformer 30, are arranged at positions contacting the outside air. Cooling efficiency is increased by arranging the cooling blower 7 driven by the output of the power converter 10 at a position contacting the outside air and by circulating the outside air. However, since the amount of heat generation by the switch 2, the controller 4, and the capacitor unit 6 is not large in comparison to the amount of heat generation by the primary circuit 20, the transformer 30, and the secondary circuit 40, and since failure may occur due to dust and moisture, the switch 2, the controller 4, and the capacitor unit 6 are arranged in a hermetically-sealed space that does not contact the outside air.

Figure 3:
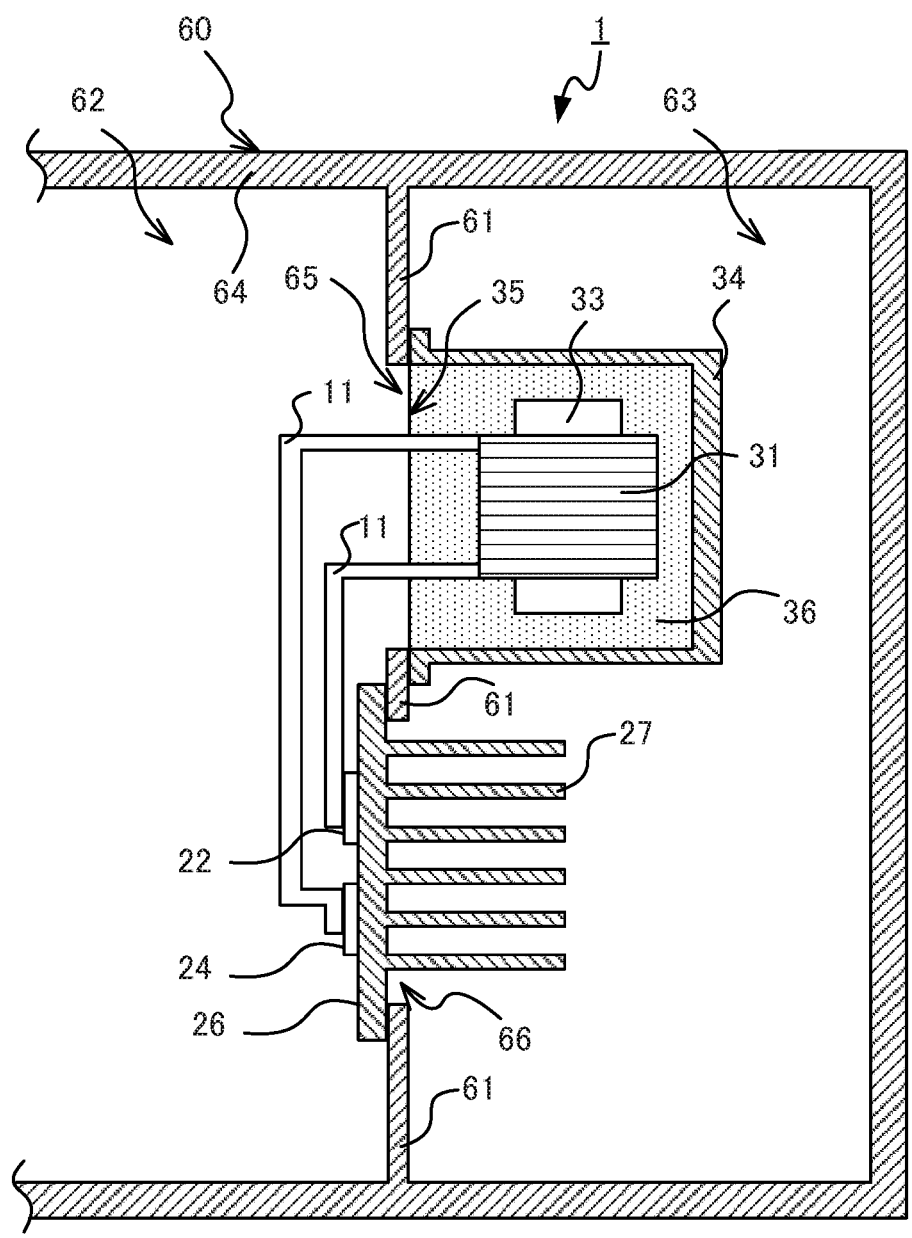
FIG. 3 is a cross-sectional drawing of the power conversion device according to the embodiment.
Figure 4:
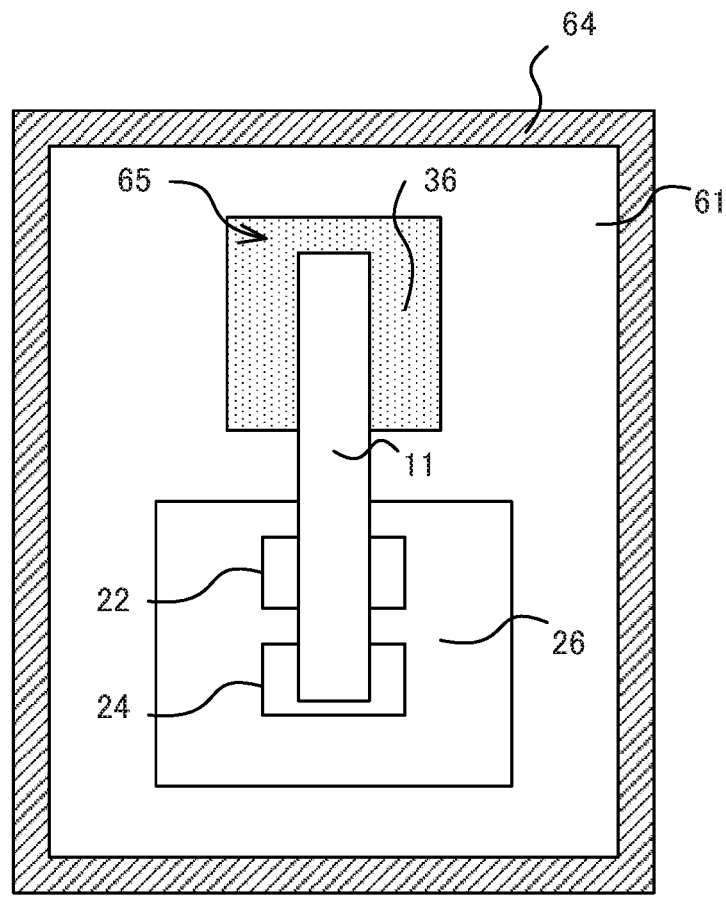
FIG. 4 is a view as seen from a sealed part to an open part of the power conversion device according to the embodiment.

FIG. 3 is a cross-sectional drawing of the power conversion device according to the embodiment. The interior of a housing 60 of the power conversion device 1 is divided by a partition 61 into a sealed part 62 into which the outside air does not enter, and an open part 63 into which the outside air enters. The expression "outside air does not enter" means that the amount of the outside air that enters is sufficiently small, and the water-resistance and dust-resistance required for the sealed part 62 are secured. The partition 61 is formed of a metal material such as iron, aluminum, or the like. FIG. 4 is a view as seen from a sealed part to an open part of the power conversion device according to the embodiment.

The configuration of the parts connecting with the primary circuit 20 and the transformer 30 are described in detail with reference to FIG. 3 and FIG. 4. Among each of the parts of the primary circuit 20 contained by the sealed part 62, FIG. 3 and FIG. 4 illustrate the switching elements 22 and 24. The first housing 64 forming the sealed part 62 or included in the sealed part 62 contains the switching elements 22, 23, 24, and 25 connected to the first connection conductor 11. In the example of FIG. 3 and FIG. 4, the first housing 64 forms the sealed part 62 from the partition 61 and a portion of the housing 60. A first opening part 65 through which the first connection conductor 11 is inserted is arranged in the partition 61 of the first housing 64.

A third housing 34 contains the transformer 30. Among surfaces of the third housing 34, the first connection conductor 11 is inserted through an aperture surface 35 that is an aperture. The interior of the third housing 34 is filled with an insulating member 36; and an iron core 33 and the primary winding 31 of the transformer 30, and a portion of the first connection conductor 11, are sealed by the insulating member 36. The third housing 34 is formed from a material such as aluminum that has a thermal conductivity greater than or equal to a threshold. The threshold can be determined freely in accordance with the desired heat dissipation performance. The insulating member 36 is a member that is in the liquid state during loading, hardens due to curing treatment, is insulating, and has a thermal conductivity greater than or equal to a threshold. Epoxy resin can be used as the insulating member 36. The threshold with respect to thermal conductivity can be determined freely in accordance with the desired heat dissipation performance. The heat generated by the primary winding 31 is transmitted to the third housing 34 via the insulating member 36 and is released from the third housing 34 to the outer of the third housing 34. The third housing 34 is arranged in the open part 63, and at least a portion of the outer surface of the third housing 34 contacts the outside air, so that heat is efficiently released from the third housing 34, and the transformer 30 is cooled.

The first opening part 65 faces the aperture surface 35 filled with the insulating member 36 and is blocked by the aperture surface 35. The first opening part 65 is blocked by the aperture surface 35, the third housing 34 is fastened to the partition 61 by a non-illustrated bolt, and thus the water-resistance and dust-resistance desired for the sealed part 62 are secured. The aperture surface 35 filled with the insulating member 36 is arranged so as to face the sealed part 62, and thus even in the case in which a gap is formed between the first connection conductor 11 and the insulating member 36, there is no attachment of moisture or dust from the gap to the iron core 33 and the primary winding 31.

The shortest distance between the edge of the first opening part 65 and the first connection conductor 11 is greater than or equal to a first threshold. The first threshold can be determined freely in accordance with the material of the partition 61. The first connection conductor 11 is arranged so as to be separated from the edge of the first opening part 65 by an amount such that induction heating does not occur in the partition 61.

The first connection conductor 11 is connected by non-illustrated bolts to each of the switching elements 22 and 24. The switching elements 22 and 24 are arranged on a board 26. Fins 27 serving as a heat sink are arranged, among surfaces of the board 26, on a surface opposite to the surface on which the switching elements 22 and 24 are arranged. The fins 27 are exposed to the outer of the first housing 64 from a hole 66 arranged in the partition 61. That is to say, the fins 27 extending away from the sealed part 62 in the direction toward the open part 63 are formed on the board 26.

Due to equipping of the open part 63 with the cooling blower 7, inflowing outside air flows from the fins 27 toward the third housing 34, and cooling efficiency of the switching elements 22 and 24 and the transformer 30 increases.

The configuration of the parts connecting together the primary circuit 20 and the transformer 30 and the configuration of the parts connecting together the secondary circuit 40 and the transformer 30 are the same. In the same manner as the aforementioned example, second housing forming the housing of the sealed part 62, and formed from a portion of the housing 60 and the partition 61, contains the diodes 41, 42, 43, and 44 connected to the second connection conductor 12. In the partition 61 of the second housing, the second opening part is arranged through which is inserted the second connection conductor 12. The first housing 64 and the second housing may be separate housings independently arranged in the sealed part 62, or may be the same housing forming the sealed part 62 or arranged in the sealed part 62. The first opening part 65 and the second opening part may be separate opening parts, or may be the same opening part.

Figure 5:
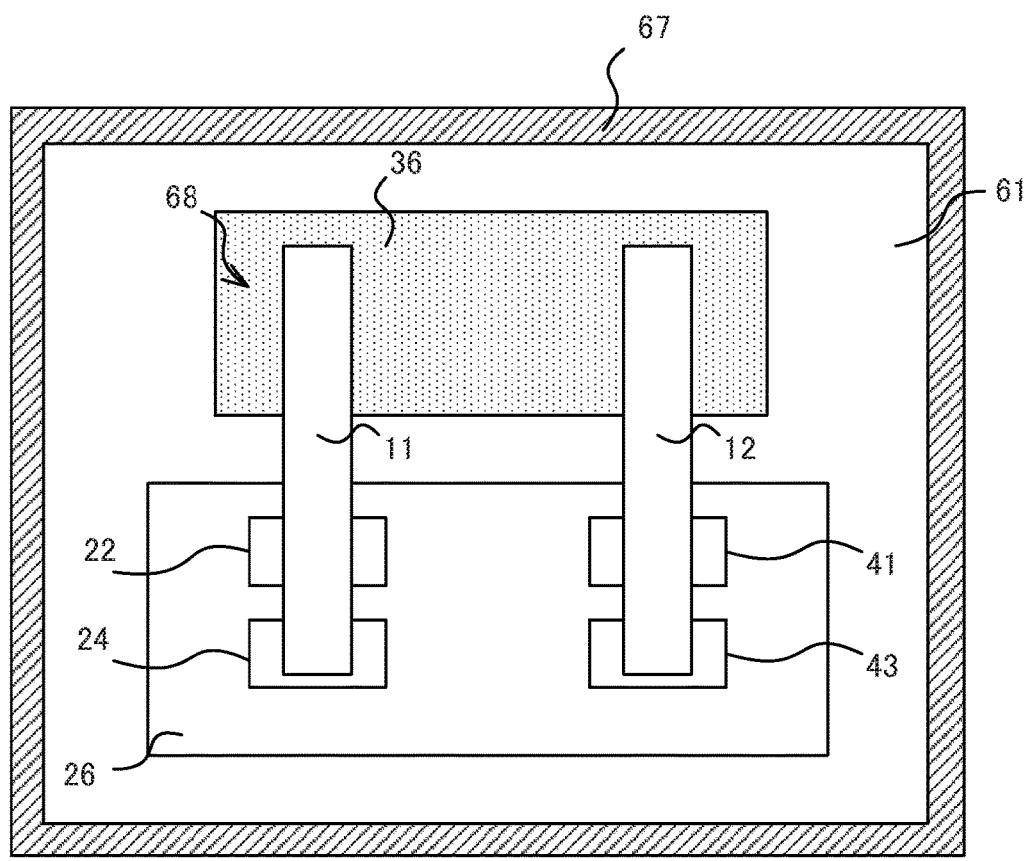
FIG. 5 is a view as seen from a sealed part to an open part of a power conversion device according to a different example of the embodiment.

FIG. 5 is a view as seen from a sealed part to an open part of a power conversion device according to a different example of the embodiment. In the example of FIG. 5, a housing 67 that is the first housing 64 and the second housing contains the switching elements 22, 23, 24, and 25 and the diodes 41, 42, 43, and 44. Among each of the parts of the primary circuit 20 and the secondary circuit 40 contained by the sealed part 62, FIG. 5 illustrates the switching elements 22 and 24 and the diodes 41 and 43. In the example of FIG. 5, an opening part 68 that is the first opening part 65 and the second opening part faces the aperture surface 35 filled with the insulating member 36 and is blocked by the aperture surface 35. The shortest distance between the edge of the opening part 68 and the first connection conductor 11 is greater than or equal to the first threshold, and the shortest distance between the edge of the opening part 68 and the second connection conductor 12 is greater than or equal to a second threshold. The second threshold can be determined freely in the same manner as the first threshold.

The first connection conductor 11 is arranged so as to be separated from the edge of the opening part 68 by an amount such that induction heating does not occur in the partition 61, and the second connection conductor 12 is arranged so as to be separated from the edge of the opening part 68 by an amount such that induction heating does not occur in the partition 61. In the example of FIG. 5, the switching elements 22, 23, 24, and 25 and the diodes 41, 42, 43, and 44 are arranged on the same board 26, and among the surfaces of the board 26, the fins 27 are arranged on the surface opposite to the surface on which the switching elements 22, 23, 24, and 25 and the diodes 41, 42, 43, and 44 are arranged. The fins 27 are exposed to the open part 63, which is outside the housing 67, from a hole arranged in the partition 61.

Figure 6:
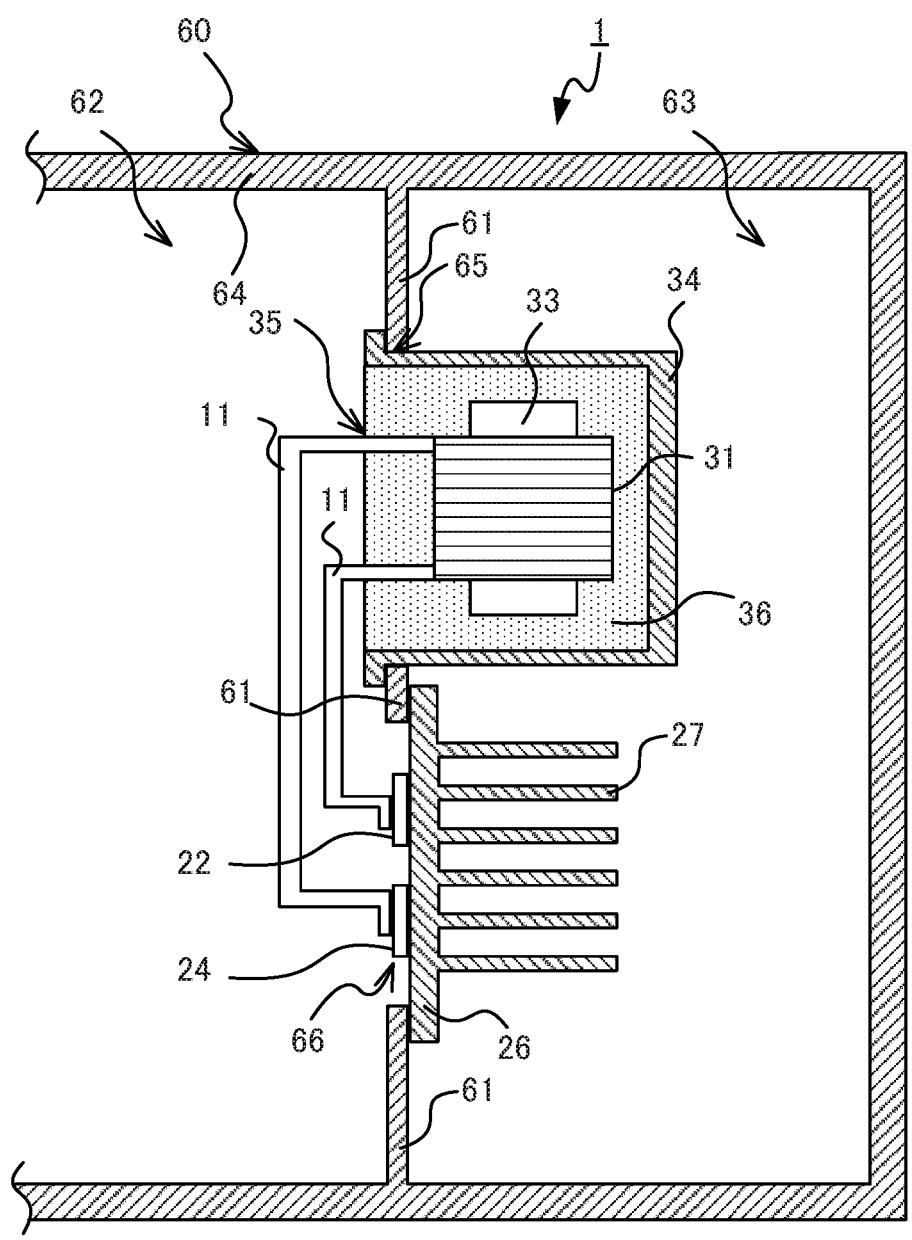
FIG. 6 is a cross-sectional drawing of a modified example of the power conversion device according to the embodiment.
Figure 7:
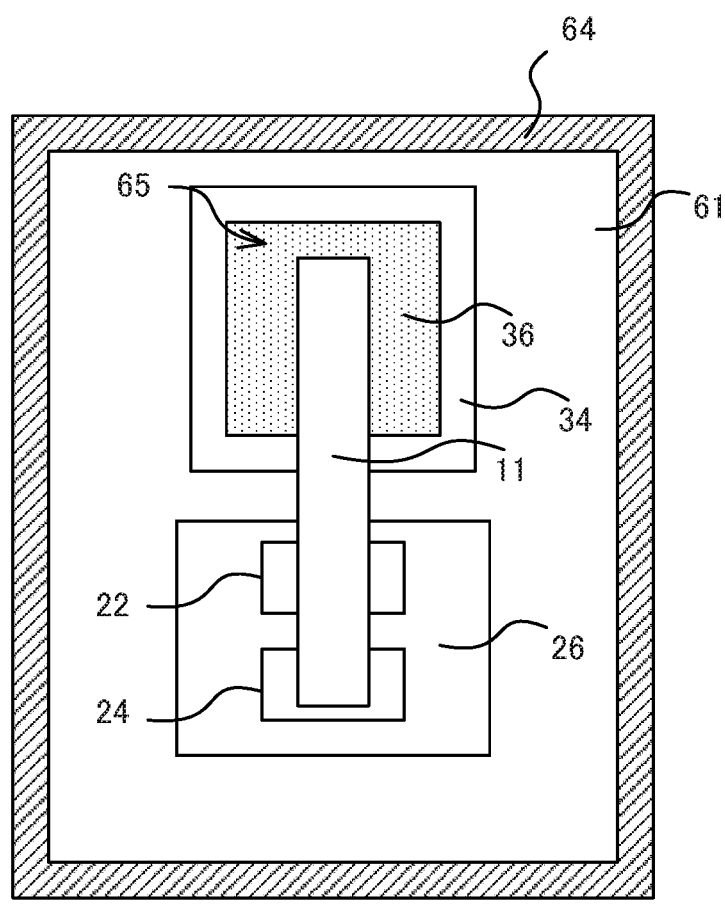
FIG. 7 is a view as seen from a sealed part to an open part of a modified example of the power conversion device according to the embodiment.

FIG. 6 is a cross-sectional drawing of a modified example of the power conversion device according to the embodiment. The view of this drawing is similar to that of FIG. 3. FIG. 7 is a view as seen from a sealed part to an open part of the power conversion device according to the embodiment. The view of this drawing is similar to that of FIG. 4. The configuration of the power conversion device 1 illustrated in FIG. 6 and FIG. 7 is similar to the configuration of the power conversion device 1 illustrated in FIG. 3 and FIG. 4, although the attachment directions of the third housing 34 and the fins 27 are different. In the example of FIG. 6 and FIG. 7, the third housing 34 is attached to the partition 61 from the sealed part 62 side, and the first opening part 65 is blocked by the aperture surface 35. Further, in the example of FIG. 6 and FIG. 7, the fins 27 are attached to the partition 61 from the open part 63 side, and the fins 27 are exposed to the outer of the first housing 64. The configuration of the power conversion device 1 is not limited to the aforementioned examples. In the power conversion device 1, the third housing 34 as illustrated in FIG. 3 and FIG. 4 may be attached from the open part 63 side to the partition 61, and the fins 27 as illustrated in FIG. 6 and FIG. 7 may be attached from the open part 63 side to the partition 61. Further, in the power conversion device 1, the third housing 34 as illustrated in FIG. 6 and FIG. 7 may be attached from the sealed part 62 side to the partition 61, and the fins 27 as illustrated in FIG. 3 and FIG. 4 may be attached from the sealed part 62 side to the partition 61.

As described above, per the power conversion device 1 according to the embodiment, the first opening part 65 and the second opening part arranged in the partition 61 are blocked by the aperture surface 35 filled with the insulating member 36, and thus the configuration of the parts connecting together the primary circuit 20 and the transformer 30 and the configuration of the parts connecting together the secondary circuit 40 and the transformer 30 can be simplified. The third housing 34 containing the transformer 30 is arranged in the open part 63, and thus the transformer 30 can be cooled. Further, the first connection conductor 11 is arranged at a position so as to be separated by a fixed distance from the edge of the first opening part 65, and the second connection conductor 12 is arranged at a position so as to be separated by a fixed distance from the edge of the second opening part, thus enabling prevention of induction heating of the components in the vicinity of the transformer 30.

Embodiments of the present disclosure are not limited to the aforementioned embodiments. The configuration of the power converter 10 is not limited to the example of FIG. 2, and the power converter 10 may be a direct-current-to-direct-current converter (DC-DC converter). The transformer 30 may be an air core transformer.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Power conversion device
2 Switch
3 Input reactor
4 Controller
5 Reactor unit
6 Capacitor unit
7 Cooling blower
10 Power converter
11 First connection conductor
12 Second connection conductor
20 Primary circuit
21, 51 Capacitor
22-25, 52-57 Switching element
26 Board
27 Fins
30 Transformer
31 Primary winding
32 Secondary winding
33 Iron core
34 Third housing
35 Aperture surface
36 Insulating member
40 Secondary circuit
41-44 Diode
50 Three-phase inverter circuit
60, 67 Housing
61 Partition
62 Sealed part
63 Open part
64 First housing
65 First opening part
66 Hole
68 Opening part
101 Power contact line
102 Power collector
103 Load device

The invention claimed is:

1. A power conversion device comprising:
a transformer to convert power in a state in which a primary side and a secondary side are insulated from each other;
a first connection conductor to electrically connect together a primary winding of the transformer and a primary-side electronic component;
a second connection conductor to electrically connect together a secondary winding of the transformer and a secondary-side electronic component;
a first housing containing the primary-side electronic component and comprising a first opening part through which the first connection conductor is inserted;
a second housing containing the secondary-side electronic component and comprising a second opening part through which the second connection conductor is inserted; and
a third housing containing the transformer and comprising a surface in which an aperture is formed through which the first connection conductor and the second connection conductor are inserted, wherein
an interior of the third housing is filled with an insulating member, and the insulating member in the interior of the third housing seals the transformer, a portion of the first connection conductor, and a portion of the second connection conductor,
the first opening part and the second opening part are blocked by one surface, in which is formed the aperture, of the third housing filled with the insulating member,
a shortest distance between an edge of the first opening part and the first connection conductor is greater than or equal to a first threshold, and a shortest distance between an edge of the second opening part and the second connection conductor is greater than or equal to a second threshold, and
the third housing is disposed at a position such that at least a portion of an outer surface of the third housing contacts outside air.

2. The power conversion device according to claim 1, wherein
an interior of a housing of the power conversion device is divided by a partition into a sealed part into which the outside air does not enter and an open part into which the outside air enters, the first housing and the second housing form the sealed part or are disposed in the sealed part, and the first opening part and the second opening part are opening parts arranged in the partition, and
the third housing is disposed in an interior of the open part such that the first opening part and the second opening part are blocked by one surface, in which is formed the aperture, of the third housing.

3. The power conversion device according to claim 1, wherein
a hole is formed in a portion of the first housing contacting a board on which is disposed the primary-side electronic component, and among surfaces of the board, a heat sink formed on a surface opposite to a surface on which the primary-side electronic component is disposed is exposed to an outer of the first housing, and
a hole is disposed in a portion of the second housing contacting a board on which is disposed the secondary-side electronic component, and among surfaces of the board, a heat sink formed on a surface opposite to a surface on which the secondary-side electronic component is disposed is exposed to an outer of the second housing.

4. The power conversion device according to claim 2, wherein
the first housing and the second housing are a same housing forming the sealed part or disposed in the sealed part, and the first opening part and the second opening part are a same opening part disposed in the partition,
the third housing is disposed in the interior of the open part such that the opening part is blocked by one surface, in which is formed the aperture, of the third housing, and
a hole is disposed in a portion of the partition contacting a board on which the primary-side electronic component and the secondary-side electronic component are disposed, and among surfaces of the board, a heat sink formed on a surface opposite to a surface on which the primary-side electronic component and the secondary-side electronic component are disposed is exposed to the open part.

* * * * *